United States Patent
Pasch et al.

[11] Patent Number: 5,863,825
[45] Date of Patent: Jan. 26, 1999

[54] ALIGNMENT MARK CONTRAST ENHANCEMENT

[75] Inventors: Nicholas F. Pasch, Pacifica; Marilyn Hwan, San Carlos; Richard Osugi, Milpitas; Colin Yates, San Jose; Dawn Lee, Morgan Hill; Shumay Dou, San Jose, all of Calif.

[73] Assignee: LSI Logic Corporation, Milpitas, Calif.

[21] Appl. No.: 940,156

[22] Filed: Sep. 29, 1997

[51] Int. Cl.⁶ .................................................. H01L 21/76
[52] U.S. Cl. ............................................ 438/401; 438/462
[58] Field of Search .................................. 438/401, 462; 356/401

[56] References Cited

U.S. PATENT DOCUMENTS

| | | | |
|---|---|---|---|
| 4,992,394 | 2/1991 | Kostelak, Jr. et al. | 438/703 |
| 5,270,255 | 12/1993 | Wong | 438/543 |
| 5,271,798 | 12/1993 | Sandhu et al. | 438/745 |
| 5,477,086 | 12/1995 | Rostoker et al. | 257/737 |
| 5,482,893 | 1/1996 | Okabe et al. | 438/618 |
| 5,503,962 | 4/1996 | Caldwell et al. | 430/317 |
| 5,532,516 | 7/1996 | Pasch et al. | 257/752 |
| 5,554,555 | 9/1996 | Rostoker et al. | 437/52 |
| 5,578,519 | 11/1996 | Cho | 438/401 |
| 5,624,304 | 4/1997 | Pasch et al. | 451/287 |
| 5,629,224 | 5/1997 | Rostoker et al. | 438/14 |
| 5,663,099 | 9/1997 | Okabe et al. | 438/642 |
| 5,700,383 | 12/1995 | Feller et al. | 216/88 |
| 5,705,320 | 11/1996 | Hsu et al. | 430/313 |

OTHER PUBLICATIONS

Wolf, Stanley. "Silicon Processing for the VLSI Era vol. 2: Process Integration", Lattice Press, Sunset Beach, CA USA, pp. 245–251, 1990.

*Primary Examiner*—Charles Bowers
*Assistant Examiner*—Craig Thompson
*Attorney, Agent, or Firm*—John P. Taylor

[57] ABSTRACT

A method of providing etched alignment marks on a semiconductor workpiece that has a substantially planar surface, such as one that has been polished, for supporting accurate alignment of the workpiece in subsequent process operations. The surface of the semiconductor workpiece includes two layers of materials that abut at the workpiece surface. For example, the workpiece may include a layer of insulative material such as silicon dioxide forming several vias and a layer of conductive material such as tungsten forming plugs in the vias. The method includes etching the substantially planar surface to reduce a height of one of the materials below the height of the other material. For example, the tungstein plugs can be etched to a height that is below the height of the surrounding silicon dioxide. The location where the silicon dioxide abuts the tungsten produces a small bump. This bump then serves as an alignment mark for subsequent operations. Furthermore, such subsequent operations will replicate, and/or enhance, the topographical distinction of the alignment mark.

19 Claims, 3 Drawing Sheets

ALIGNMENT MARK CONTRAST ENHANCEMENT

BACKGROUND OF THE INVENTION

The invention relates generally to aligning a semiconductor wafer workpiece for processing operations and, more particularly, to a method of providing etched alignment marks on a semiconductor workpiece that has a substantially planar surface, thereby supporting accurate alignment of the workpiece for subsequent process operations.

Generally, integrated circuit technology is based on the ability to form numerous transistors structures on a single semiconductor substrate (die). When forming the structures, a plurality of die are often simultaneously fabricated on a single workpiece based on a semiconductor wafer. Fabrication generally represents a predetermined sequence of processing operations, some operate on the workpiece as a whole, while others operating on one portion of the workpiece at a time. For the latter group of processing operations, in order to process a specific portion of the workpiece, a machine performing the processing operation must be able to accurately and reliably align with the desired portion, perform the processing operation, and then "step" to a next portion. By correctly aligning to the desired portion of the workpiece, the structures being created in the processing operation correctly align with underlying structures previously formed.

Alignment methods typically require the existence of several topographical alignment marks. Usually, the marks are predetermined "bumps" that appear on a top surface of the workpiece. Because the top surface of the workpiece is naturally non-planar, i.e., the surface contains numerous "ridges and valleys," many bumps are available to serve as alignment marks. As a result, the processing machines can attain very accurate and reliable alignment based upon detection of back reflection for ("contrast") off the topographical alignment marks.

For many processing operations, it is often desirous to have a substantially planar workpiece surface. To obtain topographical planarity of the workpiece surface, planarization methods such as chemi-mechanical polishing can be performed on the entire workpiece. The reasons for obtaining the topographical planarity of the workpiece surface, as well as the details of the various planarization methods, is beyond the scope of the present invention and will therefore not be further discussed.

As can be readily seen, the desire to have a substantially planar workpiece surface reduces or eliminates the number and size of the alignment marks. As a result, with a substantially planar workpiece surface, it becomes difficult, if not impossible, to obtain accurate and reliable workpiece alignment for subsequent operations. The conventional solution to this problem is to only partially polish a workpiece surface, thereby retaining some topographical bumps with which to align the workpiece. Therefore, the conventional solution requires the planarization method to achieve only marginal planarity. However, if the planarization method works too well, difficulties in alignment arise. Furthermore, if the planarization method works too poorly, the benefits of planarization are diminished.

Therefore, what is needed is a method for creating a substantially planar workpiece surface while still retaining reliable alignment marks.

SUMMARY OF THE INVENTION

The foregoing problems are solved and a technical advance is achieved by a method of providing etched alignment marks on a semiconductor workpiece that has a substantially planar surface, such as one that has been polished, for supporting accurate alignment of the workpiece in subsequent process operations. In one embodiment, the surface of the semiconductor workpiece includes two layers of materials that abut at the workpiece surface. For example, the workpiece may include a layer of insulative material such as silicon dioxide forming several vias and a layer of conductive material such as tungsten forming plugs in the vias. The method includes etching the substantially planar surface to reduce a height of one of the materials below the height of the other material. For example, the tungsten plugs can be etched to a height that is below the height of the surrounding silicon dioxide. The location where the silicon dioxide abuts the tungsten produces a small bump. This bump then serves as an alignment mark for subsequent operations. Furthermore, such subsequent operations will replicate, and even enhance, the topographical distinction of the alignment mark.

Additional features and embodiments are shown and described in greater detail, below.

DETAILED DESCRIPTION OF THE PREFERRED EMBODIMENT

Figure 1:
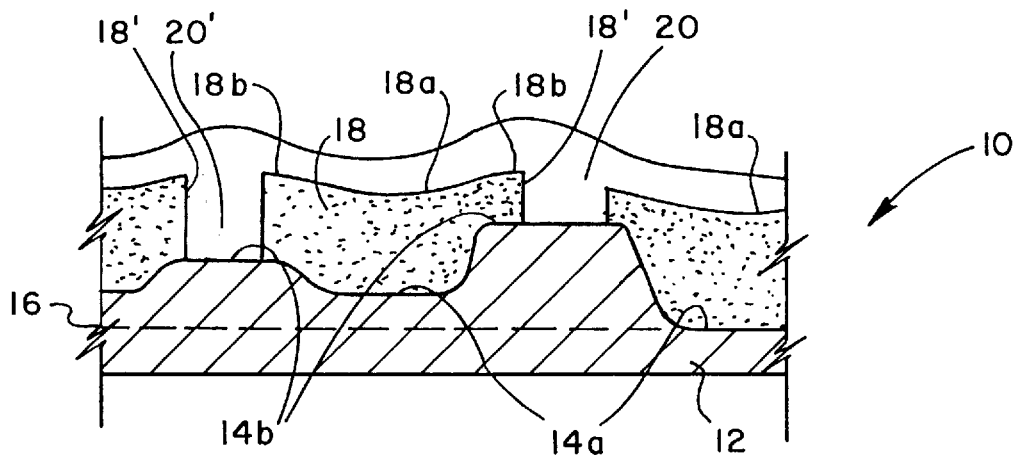
FIG. 1 is a partial cross-section of an exemplary non-planar semiconductor workpiece that includes a silicon wafer and various conductive and insulative configurations atop the silicon wafer.

Referring to FIG. 1, an exemplary non-planar semiconductor workpiece 10 includes a silicon wafer 12 (shown in phantom) having valleys 14a and ridges 14b thereon. The silicon wafer 12, together with the valleys 14a and ridges 14b, are collectively referred to as the "base wafer" and identified by the numeral 16. The workpiece 10 is only partially-fabricated, being in the middle of a sequence of processing operations. One such operation has deposited silicon dioxide 18 atop the base wafer 16. The silicon dioxide 18 generally conforms to the topography of the base wafer 16, exhibiting valleys 18a and ridges 18b. The silicon dioxide 18 has also been subjected to photolithography and etching operations, forming vias 18'. The vias 18' extend through the silicon dioxide 18 to the base wafer 16. A metal layer 20 is deposited over the silicon dioxide 18 to fill the vias 18', thereby forming plugs 20' and covering the silicon dioxide 18. This specific configuration of the base wafer 16, the silicon dioxide 18, and the metal layer 20 is intended only as an example for purposes of this discussion. The embodiments of the invention apply to many different sequences of process operations, as will be readily appreciated by those of ordinary skill in the art.

Figure 2:
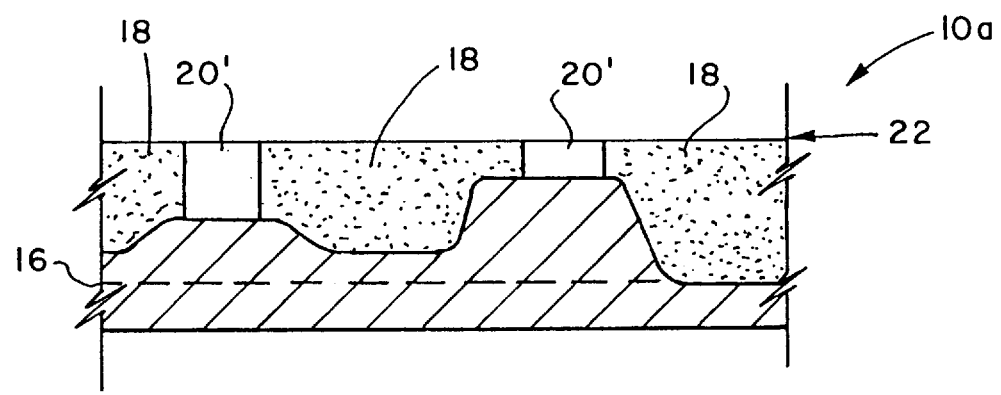
FIG. 2 illustrates the semiconductor workpiece of FIG. 1 after having its top surface planarized.

Referring to FIG. 2, the next process operation serves to planarize the non-planar workpiece 10. Thus, a planar workpiece 10a is obtained form the non-planar workpiece 10. Such planarization may be achieved by chemi-mechanical polishing the non-planar workpiece 10. The planar workpiece 10a, in contrast to the non-planar workpiece 10, has a top surface 22 which is substantially planar, i.e., the surface 22 is smooth and flat, and does not exhibit any significant topographical variation.

Although not shown, the predetermined sequence of processing oeprations next requires that a metal layer be deposited on the planar workpiece 10a to connect with the plugs 20'. The deposited metal layer would generally conform to the surface 22, and would therefore also have a substantially planar surface. However, this is problematic because subsequent processing operations (e.g., photolithography patterning) will not have sufficient topographical variation with which to accurately align the workpiece.

Figure 3:
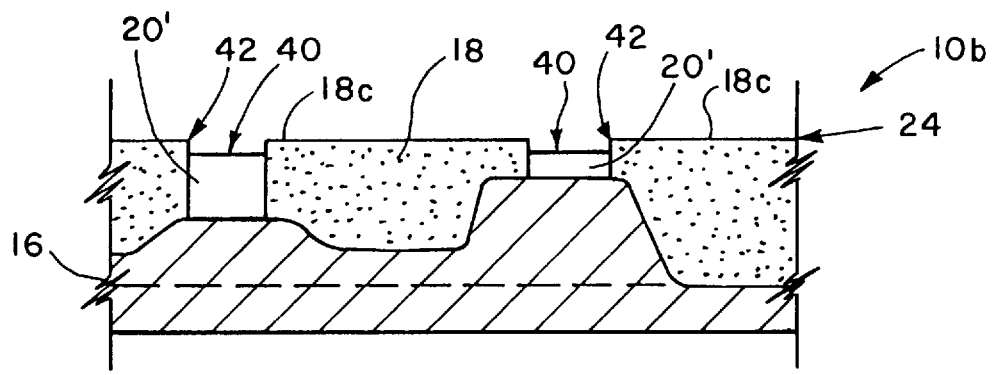
FIGS. 3 and 5 illustrate the semiconductor workpiece of FIG. 2 after an etching process operation has formed an indention on the top surface, according to embodiments of the invention.

Referring to FIG. 3, instead of proceeding to the metal deposition operation, the workpiece 10a goes through an etching process to produce an intermediate workpiece 10b. For the sake of example, if the plug 20' is made of tungsten, either an isotropic or anisotropic dry plasma etch with fluorocarbons or an isotropic wet etch with hydrogen peroxide may be performed. Those skilled in the art will know appropriate etching chemistries and parameters, and therefore the etching operation will not be described in detail.

As a result of the etching process operation, a surface 24 of the intermediate workpiece 10b remains substantially planar, like the surface 22 of the workpiece 10a (shown in FIG. 2). However, due to the differing chemical characteristics of the silicon dioxide 18 and the tungsten plug 20', a small indention 40 is formed in the plug 20' (as shown in FIG. 3). The indention 40 is of a relatively shallow depth, typically in a range of 50 Å to 500 Å, below a top 18c of the silicon dioxide 18. The difference in heights at the abutment between the plug 20' and the silicon dioxide 18 provides sufficient non-planarity to form a bump 42.

Figure 4:
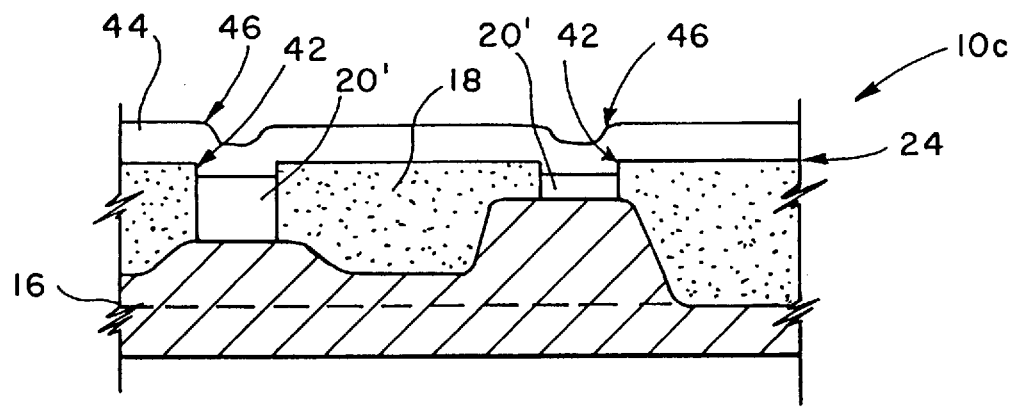
FIGS. 4 and 6 illustrate the semiconductor workpieces of FIGS. 3 and 5, respectively, after subsequent processing operations have been performed.

Referring to FIG. 4, now that the bump 42 has been formed, the intermediate workpiece 10b may continue with the predetermined sequence of processing operations. In the present example, the next process operation is metal deposition in which a metal such as aluminum alloy is deposited. Therefore, a new workpiece 10c is formed. The workpiece 10c has a top layer 44 of the deposited aluminum alloy, which generally conforms to the surface 24 thereby replicating and/or augmenting the bump 42 as a new bump 46. The bump 46 can now serve as an alignment mark to accurately align the workpiece 10c for subsequent processing operations.

Figure 5:
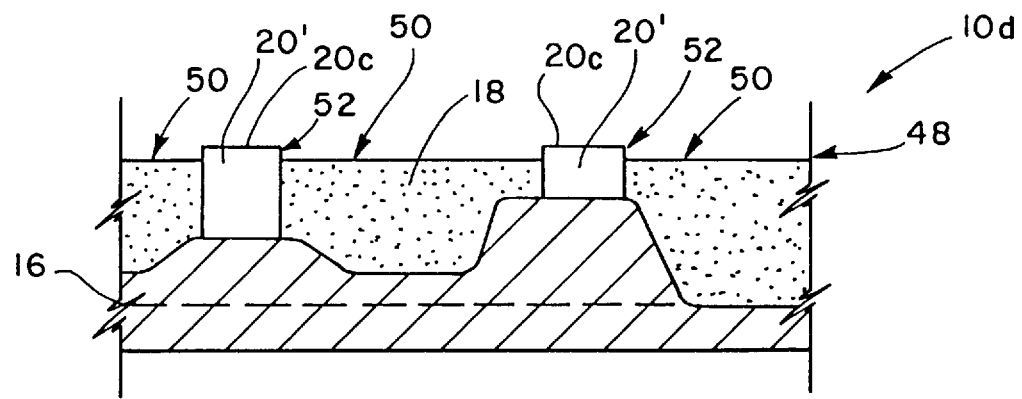

Referring to FIG. 5, in another embodiment, instead of using the etching process that formed the intermediate workpiece 10b (FIG. 3), another etching process may produce an intermediate workpiece 10d. For example, a fluoride-based etch may be performed, producing a surface 48 of the intermediate workpiece 10d which remains substantially planar, like the surface 22 of the workpiece 10a. However, due to the differing chemical characteristics of the silicon dioxide 18 and the tungsten plug 20', a small indention 50 is formed into the silicon dioxide 18. The indention 50 is of shallow depth, typically in a range of 50 Å to 500 Å, below a top 20d of the plug 20'. The difference in heights at the abutment between the silicon dioxide 18 and the plug 20' provides sufficient non-planarity to form a bump 52.

Figure 6:
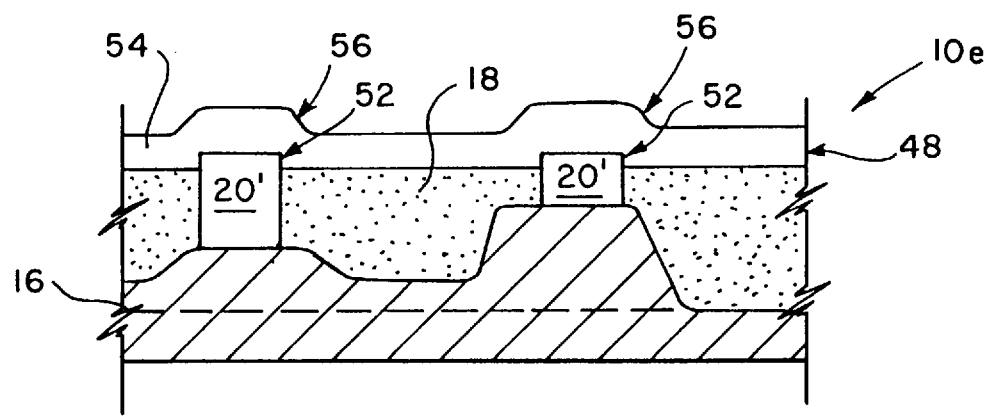

Referring to FIG. 6, now that the bump 52 has been formed, the intermediate workpiece 10d may continue with the predetermined sequence of processing operations. Continuing with the above-described example, when the aluminum alloy has been deposited, a new workpiece 10e is formed. The workpiece 10e has a top layer 54 of the deposited aluminum alloy, which generally conforms to the surface 48, thereby replicating and/or augmenting, the bump 52 as a new bump 56. The bump 56 can now serve as an alignment mark to accurately align the workpiece 10e for subsequent processing operations.

Although illustrative embodiments of the invention have been shown and described, a wide range of modification, change, and substitution is contemplated in the foregoing disclosure and in some instances, some features of the present invention may be employed without a corresponding use of the other features. For example, planarization may occur by many different methods or may occur after different processing operations. Regardless of when or how the planarization occurs, selective etching creates a height difference between two abutting materials, thereby creating a bump that provides suitable contrast for use as an enhanced alignment mark. Accordingly, it is appropriate that the appended claims be construed broadly and in a manner consistent with the scope of the invention.

What is claimed is:

1. A method of enhancing an alignment mark contrast of a semiconductor wafer workpiece formed with vias, comprising the steps of:

a) depositing a metal layer over said semiconductor wafer workpiece and in said vias;

b) planarizing the top surface of said semiconductor wafer workpiece by polishing said semiconductor wafer workpiece to remove said metal layer not located within said vias; and c) selectively etching the portion of said metal layer remaining within one of said vias to reduce the height of said portion of said metal layer remaining within said one of said vias to below a height of said semiconductor wafer workpiece adjacent said one of said vias;

whereby said reduced height of said portion of said metal layer within said one of said vias relative to the rest of said semiconductor wafer workpiece provides an enhanced alignment mark contrast.

2. The method of claim 1, wherein the step of depositing is performed by chemical vapor deposition.

3. The method of claim 1, wherein an etch chemistry for the step of etching is selected from the group consisting of an isotropic dry plasma etch with fluorocarbons, an anisotropic dry plasma etch with fluorocarbons, an isotropic wet etch with hydrogen peroxide, and an isotropic wet etch with mineral acids.

4. The method of claim 1, wherein the step of etching reduces the height of the metal layer within the via from about 50 Å to about 500 Å below the height of the semiconductor wafer workpiece adjacent the via.

5. The method of claim 1, wherein the step of polishing is chemi-mechanical polishing.

6. The method of claim 1, wherein the metal layer is tungsten that covers a silicon dioxide of the semiconductor wafer workpiece.

7. The method of claim 4, wherein the step of polishing is chemi-mechanical polishing.

8. A method of forming an alignment mark contrast on a semiconductor wafer workpiece formed with vias, said semiconductor wafer workpiece having a metal layer thereon covering said workpiece and filling said vias, comprising the steps of:

a) planarizing said semiconductor wafer workpiece to remove said metal layer not located within said vias; and b) then selectively reducing a height of the metal layer within one of said vias below a height of the planarized top surface of said semiconductor wafer workpiece adjacent said one of said vias;

whereby the resulting height difference in the height of said metal layer within said one or said vias and the height of said planarized top surface of said semiconductor wafer workpiece adjacent said one of said vias provides said alignment mark contrast.

9. The method of claim 8, wherein the height difference is on the order of from about 50 Å to about 500 Å.

10. The method of claim 8, wherein the metal layer is tungsten and the semiconductor wafer workpiece adjacent the metal layer includes silicon dioxide.

11. The method of claim 8, wherein the step of reducing includes an etch with etch chemistry selected from the group consisting of an isotropic dry plasma etch with fluorocarbons, an anisotropic dry plasma etch with fluorocarbons, and an isotropic wet etch with hydrogen peroxide; and wherein the step of removing is performed by chemi-mechanical polishing that preferentially polishes the tungsten to the silicon dioxide.

12. A method of forming an alignment mark contrast of a semiconductor wafer workpiece formed with vias, the method comprising the steps of:

depositing a metal over a silicon dioxide on a surface of the semiconductor wafer workpiece and within the vias;

removing the metal preferentially to removal of the silicon dioxide, to remove the metal on the surface and to substantially planarize the surface; and reducing a height of a portion of the silicon dioxide on the surface of the semiconductor wafer workpiece;

wherein the height of the portion is a distance below a height of the metal within one of the vias adjacent the portion, thereby providing a height difference in the height of the metal and the height of the silicon dioxide of the portion for the alignment mark contrast.

13. The method of claim 12, wherein the silicon dioxide after removal of the metal layer is substantially planar and includes the small indentation portion which provides the alignment mark contrast.

14. The method of claim 12, wherein the metal is tungsten and the step of removing is chemi-mechanical polishing that preferentially polishes the tungsten to the silicon dioxide.

15. A method of forming an alignment mark on a semiconductor wafer workpiece having a top surface comprising two abutting materials, the method comprising the steps of:

a) planarizing said top surface of said semiconductor wafer workpiece comprising said two abutting materials;

b) then performing a selective etching operation on said planarized top surface of said semiconductor wafer workpiece to reduce a height of a first material of said two abutting materials below a height of a second material of said two abutting materials; and c) depositing a layer on top of the etched surface;

wherein the layer forms the alignment mark at the abutment of said two abutting materials of uneven height.

16. The method of claim 15 wherein the first material is conductive and the second material is insulative.

17. The method of claim 15 wherein the first material is insulative and the second material is conductive.

18. A method of forming an alignment mark on a semiconductor wafer comprising the steps of:

a) forming a layer of silicon dioxide over an upper surface of said semiconductor wafer;

b) forming a plurality of vias in said silicon dioxide layer;

c) depositing a metal layer over an upper surface of said silicon dioxide layer which fills said vias;

d) planarizing the resulting structure to remove those portions of said metal layer which are on the surface of said silicon dioxide layer, leaving said metal in said vias level with said upper surface of said silicon dioxide layer; and e) then preferentially etching said silicon dioxide layer on said upper surface of said semiconductor wafer relative to said metal in an adjacent via;

whereby the height of said portion of said silicon dioxide layer adjacent said via after said etch will be below the height of said metal within said adjacent via, thereby providing a height difference forming said alignment mark.

19. A method of forming an alignment mark on a semiconductor wafer comprising the steps of:

a) forming a layer of silicon dioxide over an upper surface of said semiconductor wafer;

b) forming a plurality of vias in said silicon dioxide layer;

c) depositing a metal layer over an upper surface of said silicon dioxide layer which fills said vias;

d) planarizing the resulting structure to remove those portions of said metal layer which are on the surface of said silicon dioxide layer, leaving said metal in said vias level with said upper surface of said silicon dioxide layer; and e) then preferentially etching said metal in one of said vias relative to said adjacent silicon dioxide layer on said upper surface of said semiconductor wafer;

whereby the height of said metal in said preferentially etched via will be below the height of said silicon dioxide layer adjacent said via after said etch, thereby providing a height difference forming said alignment mark.

* * * * *